US008673743B2

(12) United States Patent  
Arai

(10) Patent No.: US 8,673,743 B2  
(45) Date of Patent: Mar. 18, 2014

(54) WAFER DIVIDING METHOD

(75) Inventor: Kazuhisa Arai, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/598,147

(22) Filed: Aug. 29, 2012

(65) Prior Publication Data

US 2013/0059428 A1 Mar. 7, 2013

(30) Foreign Application Priority Data

Sep. 1, 2011 (JP) ................................. 2011-190647

(51) Int. Cl.
*H01L 21/78* (2006.01)
*H01L 21/306* (2006.01)
*H01L 21/3065* (2006.01)
*H01L 21/683* (2006.01)

(52) U.S. Cl.
USPC ............. 438/462; 438/458; 438/463; 438/33; 438/68; 438/113; 257/E21.599; 219/121.78; 156/154

(58) Field of Classification Search
CPC ..................... H01L 21/6836; H01L 21/02098; H01L 21/78; H01L 21/30608; H01L 21/3065
USPC ..................... 438/458, 460–463, 33, 68, 113; 257/E21.599; 219/121.78; 156/154
See application file for complete search history.

(56) References Cited

U.S. PATENT DOCUMENTS

| 8,431,428 | B2 * | 4/2013 | Sekiya | 438/68 |
|---|---|---|---|---|
| 2007/0066044 | A1 * | 3/2007 | Abe et al. | 438/612 |
| 2007/0105345 | A1 * | 5/2007 | Kurosawa | 438/460 |
| 2007/0264803 | A1 * | 11/2007 | Kumakawa | 438/478 |
| 2009/0197393 | A1 * | 8/2009 | Haji et al. | 438/462 |
| 2009/0209088 | A1 * | 8/2009 | Nagasawa | 438/462 |
| 2009/0298263 | A1 * | 12/2009 | Watanabe et al. | 438/463 |
| 2010/0003805 | A1 * | 1/2010 | Arai | 438/460 |
| 2010/0015781 | A1 * | 1/2010 | Kumakawa | 438/462 |
| 2010/0044590 | A1 * | 2/2010 | Aikawa | 250/492.2 |
| 2010/0136766 | A1 * | 6/2010 | Sakamoto et al. | 438/463 |
| 2011/0027972 | A1 * | 2/2011 | Fukuyo et al. | 438/463 |
| 2011/0108957 | A1 * | 5/2011 | Utsumi et al. | 257/620 |
| 2011/0195537 | A1 * | 8/2011 | Koyanagi et al. | 438/33 |
| 2012/0100694 | A1 * | 4/2012 | Kajiyama et al. | 438/462 |
| 2012/0190175 | A1 * | 7/2012 | Fukuyo et al. | 438/463 |
| 2012/0234807 | A1 * | 9/2012 | Sercel et al. | 219/121.69 |
| 2012/0289028 | A1 * | 11/2012 | Abatake | 438/463 |
| 2012/0312793 | A1 * | 12/2012 | Nomaru | 219/121.78 |

FOREIGN PATENT DOCUMENTS

JP 2002-192370 7/2002

* cited by examiner

*Primary Examiner* — Jarrett Stark  
*Assistant Examiner* — Bitew Dinke  
(74) *Attorney, Agent, or Firm* — Greer Burns & Crain, Ltd.

(57) ABSTRACT

A wafer is divided by setting the focal point of a laser beam inside the wafer at positions corresponding to division lines, thereby forming modified layers inside the wafer along the division lines. Each modified layer has a thickness ranging from the vicinity of the front side of the wafer to the vicinity of the back side of the wafer. An etching gas or an etching liquid is supplied to the wafer to erode the modified layers, thereby dividing the wafer into individual devices. The modified layers are not crushed, so fine particles are not generated in dividing the wafer. Accordingly, fine particles do not stick to the surface of each device and cause a reduction in quality. Further, since the modified layers are removed by etching, it is possible to prevent a reduction in die strength of each device due to the remainder of the modified layers.

5 Claims, 10 Drawing Sheets

WAFER DIVIDING METHOD

BACKGROUND OF THE INVENTION

1. Field of the Invention

The present invention relates to a wafer dividing method of dividing a wafer into individual chips.

2. Description of the Related Art

A plurality of devices such as ICs and LSIs are formed on the front side of a wafer so as to be partitioned by a plurality of division lines. The wafer is divided into the individual devices by a cutting apparatus or a laser processing apparatus. These devices are widely used in various electrical equipment such as mobile phones and personal computers. As a method of dividing the wafer into the individual devices, there has been proposed and put into practical use a technique of applying a laser beam having a transmission wavelength to the wafer in the condition where the focal point of the laser beam is set inside the wafer at the positions corresponding to the division lines, thereby forming a plurality of modified layers inside the wafer along the division lines and next applying an external force to the wafer to thereby break the wafer along the modified layers as break start points, thus obtaining the individual devices (see Japanese Patent No. 3408805, for example).

SUMMARY OF THE INVENTION

However, when an external force is applied to the wafer to break the wafer along the modified layers, the modified layers are crushed to generate fine particles. Accordingly, there arises a problem such that the fine particles generated from the modified layers may stick to the surface of each device to cause a reduction in quality of each device. Further, after the wafer is divided, the modified layers partially remain on the side surfaces of each device. Accordingly, there arises another problem such that the die strength of each device may be reduced due to the remainder of the modified layers.

It is therefore an object of the present invention to provide a wafer dividing method which can prevent a reduction in quality and die strength of each device.

In accordance with an aspect of the present invention, there is provided a wafer dividing method of dividing a wafer into a plurality of devices formed on the front side of the wafer so as to be partitioned by a plurality of division lines, the wafer dividing method including a modified layer forming step of applying a laser beam having a transmission wavelength to the wafer in the condition where the focal point of the laser beam is set inside the wafer at the positions corresponding to the division lines, thereby forming a plurality of modified layers inside the wafer along the division lines, each of the modified layers having a thickness ranging from the vicinity of the front side of the wafer to the vicinity of the back side of the wafer; and an etching step of supplying an etching gas or an etching liquid to the wafer to erode the modified layers, thereby dividing the wafer into the individual devices.

Preferably, the wafer dividing method further includes an etching mask preparing step of preparing an etching mask so that the etching mask fully covers the back side of the wafer before performing the modified layer forming step; and an etching mask removing step of partially removing the etching mask along the division lines to partially expose the back side of the wafer along the division lines; wherein the modified layer forming step is performed by applying the laser beam to an exposed part of the back side of the wafer.

Alternatively, the wafer dividing method further includes an etching mask preparing step of preparing an etching mask so that the etching mask fully covers the front side of the wafer before performing the modified layer forming step; and an etching mask removing step of partially removing the etching mask along the division lines to partially expose the front side of the wafer along the division lines; wherein the modified layer forming step is performed by applying the laser beam to an exposed part of the front side of the wafer.

According to the present invention, the modified layers are eroded by the etching gas or the etching liquid in the etching step. That is, the modified layers are not crushed to thereby eliminate the generation of fine particles in dividing the wafer. Accordingly, there is no possibility that the fine particles may stick to the surface of each device to cause a reduction in quality of each device. Further, since the modified layers are removed by etching, it is possible to prevent a reduction in die strength of each device due to the remainder of the modified layers.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

1. First Preferred Embodiment

Figure 1:
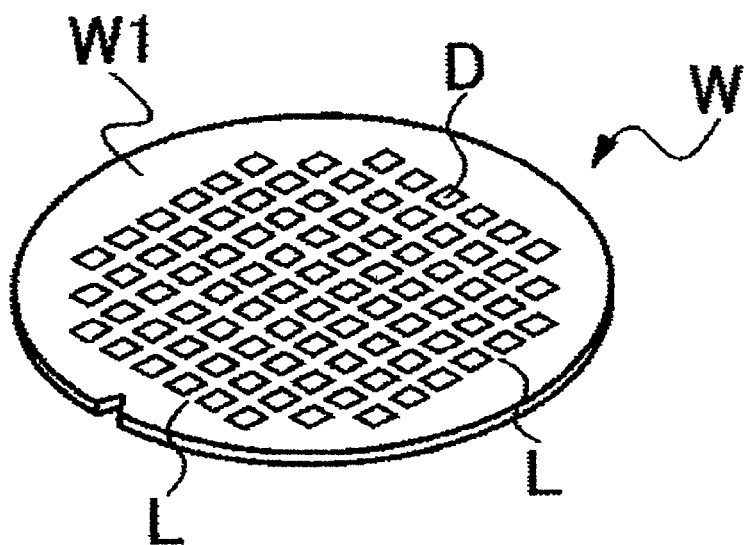
FIG. 1 is a perspective view of a wafer.

Referring to FIG. 1, there is shown a wafer W having a plurality of crossing division lines L formed on the front side W1, thereby partitioning a plurality of rectangular regions where a plurality of devices D are respectively formed.

(1) Protective Member Attaching Step

Figure 2:
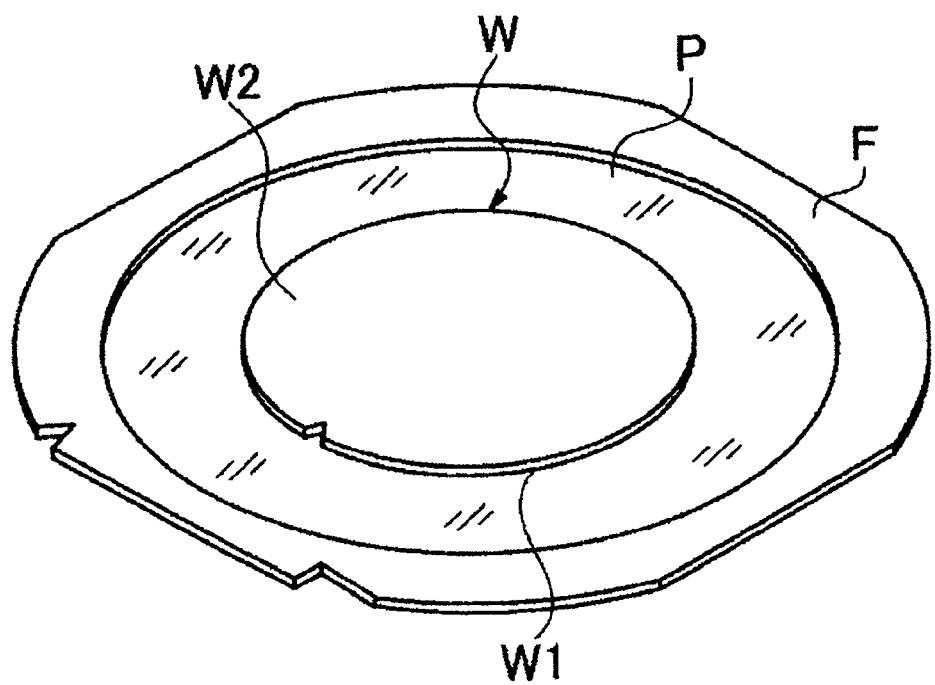
FIG. 2 is a perspective view showing a condition where the front side of the wafer is attached to a protective member supported at its peripheral portion to an annular frame.

The wafer W is reversed from the condition shown in FIG. 1 and the front side W1 of the wafer W is attached to a protective member P such as an adhesive tape as shown in FIG. 2. A ring-shaped frame F is preliminarily attached to a peripheral portion of the protective member P. Thus, the wafer W is supported through the protective member P to the frame F. In this condition, the back side W2 of the wafer W is exposed.

(2) Modified Layer Forming Step

Figure 3:
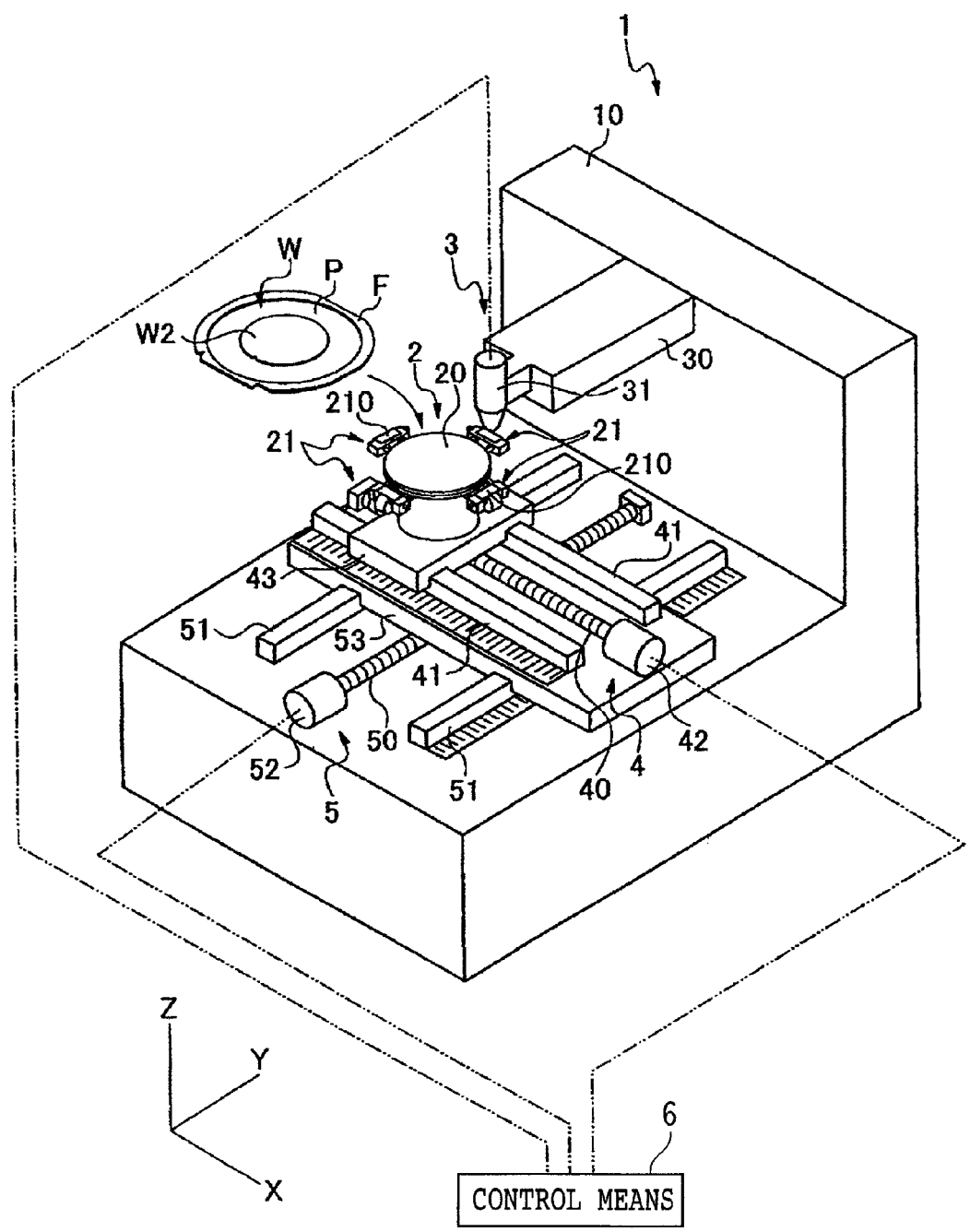
FIG. 3 is a perspective view of a laser processing apparatus.

Thereafter, a laser beam is applied to the wafer W to form a modified layer inside the wafer W along each division line L. The modified layer can be formed by using a laser processing apparatus 1 shown in FIG. 3, for example. The laser processing apparatus 1 includes a chuck table 2 as holding means for holding the wafer W as a workpiece and laser applying means 3 for applying a laser beam to the wafer W held on the chuck table 2.

The holding means 2 is composed of a holding surface 20 for holding the wafer W under suction and a plurality of fixing members 21 for fixing the frame F. Each fixing member 21 includes a pressing portion 210 for pressing the frame F from the upper side thereof. The holding means 2 is supported so as to be movable in a feeding direction (X direction) by feeding means 4 and also supported so as to be movable in an indexing direction (Y direction) perpendicular to the X direction in a horizontal plane by indexing means 5. The feeding means 4 and the indexing means 5 are controlled by control means 6.

The feeding means 4 is provided on a platelike base 53 and composed of a ball screw 40 having an axis extending in the X direction, a pair of guide rails 41 extending parallel to the ball screw 40, a motor 42 connected to one end of the ball screw 40, and a slide member 43 having a nut portion threadely engaged with the ball screw 40 and a pair of grooves slidably engaged with the pair of guide rails 41 mentioned above. When the motor 42 is operated under the control of the control means 6, the ball screw 40 is rotated to thereby slide the slide member 43 on the guide rails 41 in the X direction. The holding means 2 is provided on the slide member 43, so that the holding means 2 is movable with the slide member 43 in the X direction.

The holding means 2 and the feeding means 4 are supported so as to be movable in the Y direction by the indexing means 5. The indexing means 5 is composed of a ball screw 50 having an axis extending in the Y direction, a pair of guide rails 51 extending parallel to the ball screw 50, a motor 52 connected to one end of the ball screw 50, and the base 53 having a nut portion threadedly engaged with the ball screw 50 and a pair of grooves slidably engaged with the pair of guide rails 51 mentioned above. When the motor 52 is operated under the control of the control means 6, the ball screw 50 is rotated to thereby slide the base 53 on the guide rails 51 in the Y direction. The feeding means 4 is provided on the base 53, so that the holding means 2 and the feeding means 4 are movable with the base 53 in the Y direction.

The laser applying means 3 includes a base 30 fixed to a wall portion 10 and a laser head (focusing means) 31 fixed to the front end of the base 30. The laser head 31 functions to apply a laser beam having a beam axis extending in a vertical direction and has a focusing lens.

In the holding means 2, the wafer W is held through the protective member P on the holding surface 20 under suction and the frame F is fixed by the fixing members 21. The front side W1 of the wafer W held by the holding means 2 is imaged by a camera (not shown) to detect the division lines L. In this preferred embodiment, the camera is located above the back side W2 of the wafer W. Accordingly, an infrared camera is used to apply infrared light from a position above the back side W2 through the wafer W to image the front side W1.

Figure 4:
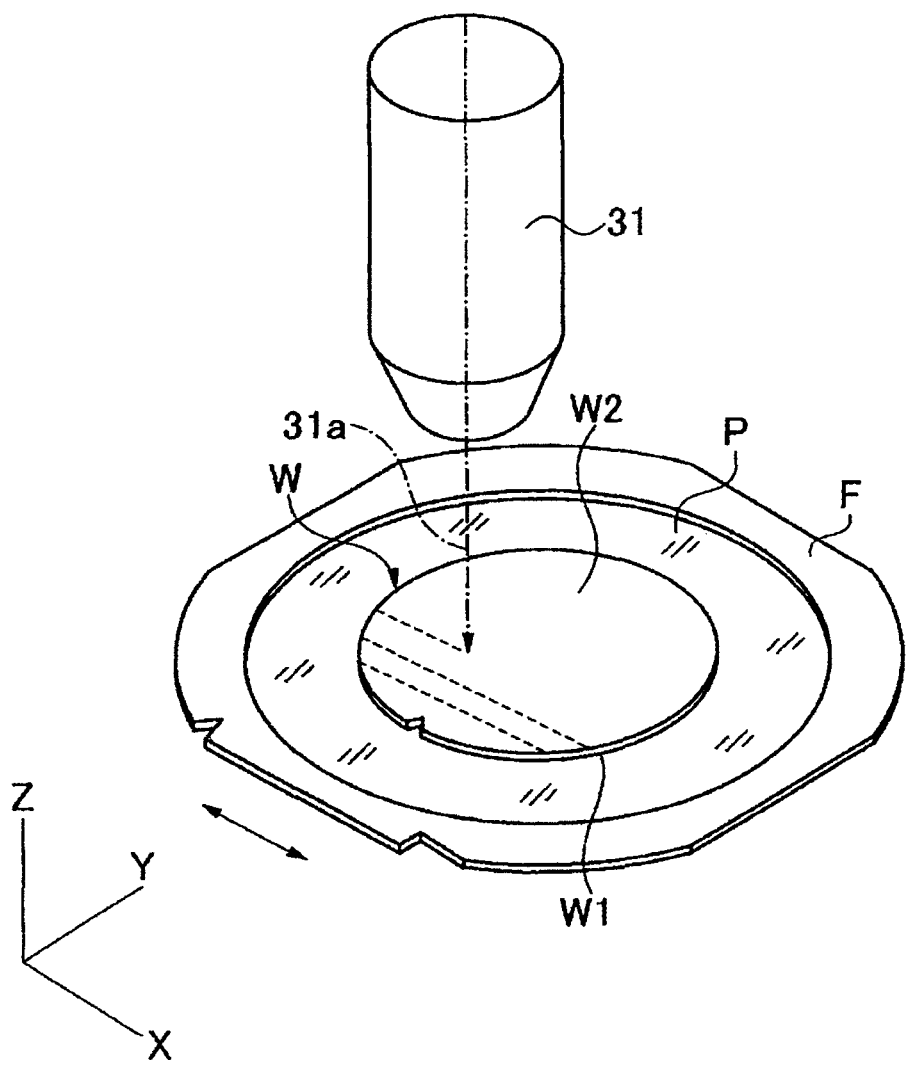
FIG. 4 is a perspective view showing a modified layer forming step in a wafer dividing method according to a first preferred embodiment of the present invention.

After detecting the division lines L, a predetermined one of the division lines L is aligned to the laser head 31 in the Y direction. Further, the wafer W held by the holding means 2 is fed in the X direction and a laser beam 31a having a transmission wavelength to the wafer W is applied from the laser head 31 to the wafer W along this predetermined division line L as shown in FIG. 4. The focal point of the laser beam 31a is set inside the wafer W, i.e., between the front side W1 and the back side W2 of the wafer W. For example, this laser processing is performed under the following conditions.

Figure 5:
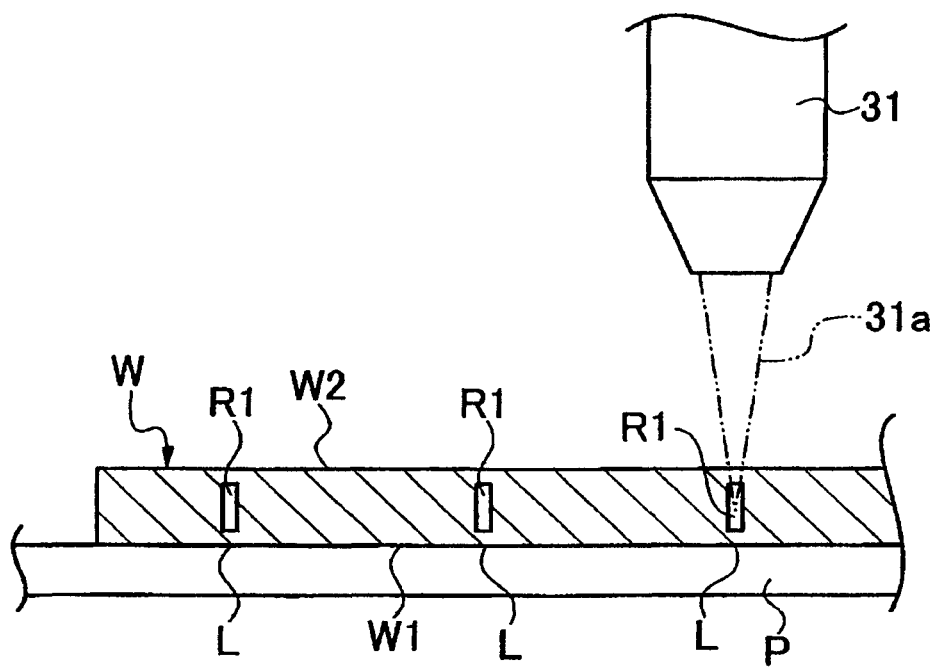
FIG. 5 is a sectional view showing the modified layer forming step shown in FIG. 4.

Wavelength of the laser beam: 1064 nm
Average power: 0.3 W
Repetition frequency: 100 kHz
Spot diameter: 1 μm
Feed speed: 100 mm/sec By focusing the laser beam inside the wafer W under the above processing conditions, a modified layer R1 having a thickness ranging from the vicinity of the front side W1 to the vicinity of the back side W2 is formed inside the wafer W along this predetermined division line L as shown in FIG. 5. In forming the modified layer R1, the focal point of the laser beam may be moved along the thickness of the wafer W as required to thereby adjust the thickness of the modified layer R1. Alternatively, a plurality of modified layers R1 may be formed along the thickness of the wafer W in the range from the vicinity of the front side W1 to the vicinity of the back side W2. Thereafter, the movement (indexing) of the holding means 2 in the Y direction and the movement (feeding) of the holding means 2 in the X direction are similarly performed to apply the laser beam along the division lines L extending in a first direction. Thereafter, the holding means 2 is rotated 90° to similarly perform the laser processing along the other division lines L extending in a second direction perpendicular to the first direction. As a result, a plurality of modified layers R1 are formed inside the wafer W along all of the division lines L as shown in FIG. 6.

(3) Etching Step

Figure 6:
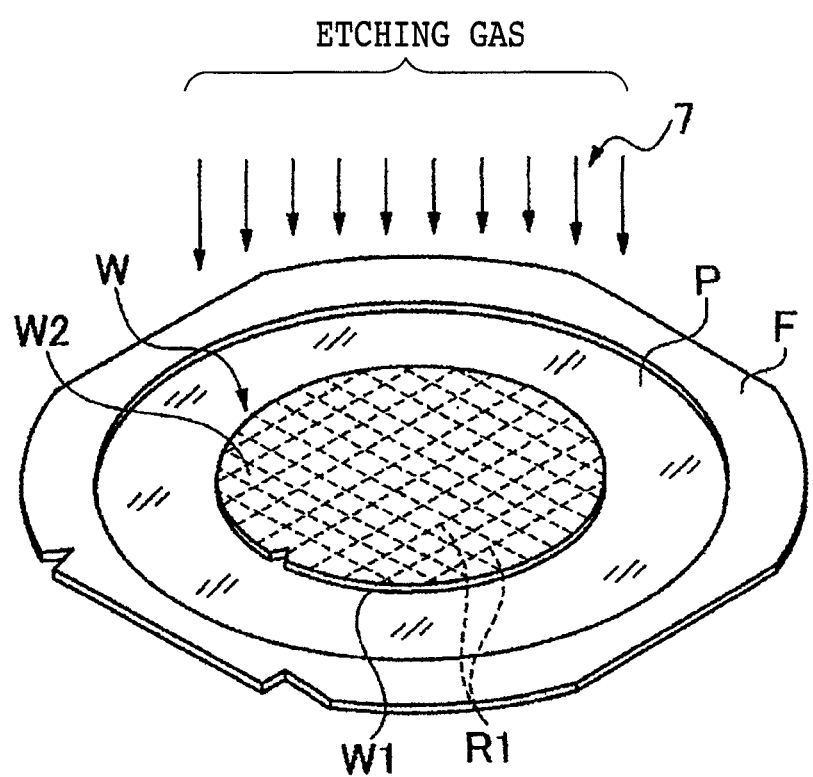
FIG. 6 is a perspective view showing an etching step in the wafer dividing method according to the first preferred embodiment.
Figure 7:
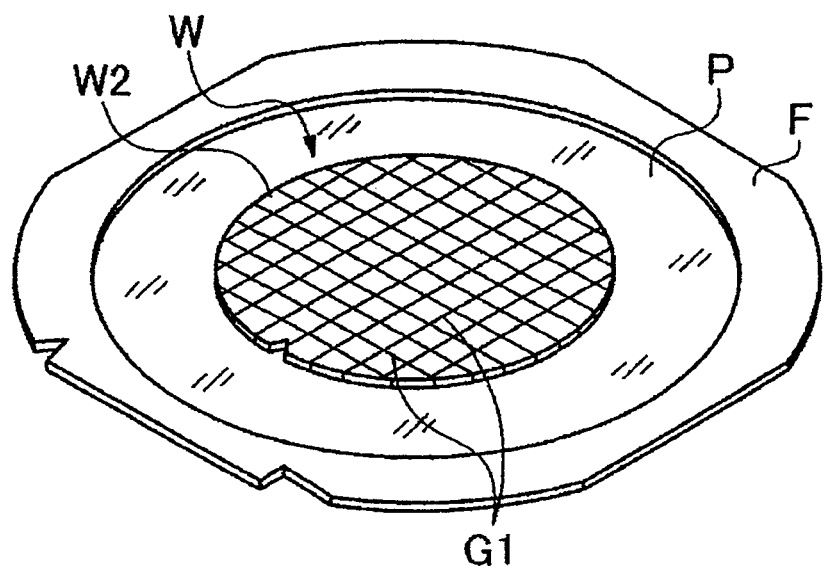
FIG. 7 is a perspective view showing the wafer divided by the etching step shown in FIG. 6.
Figure 8:
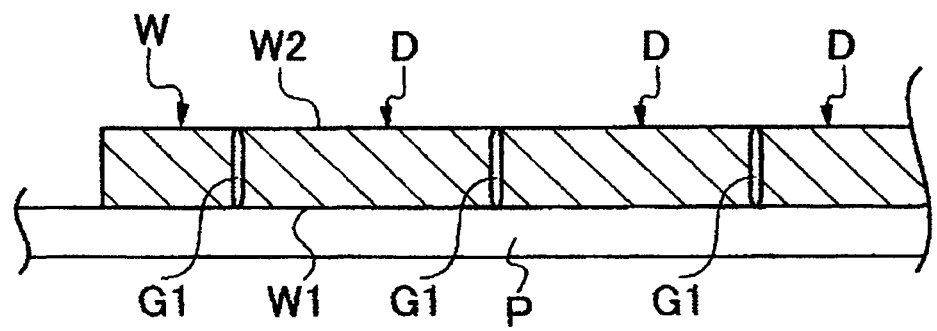
FIG. 8 is a sectional view showing the wafer shown in FIG. 7.

After forming the modified layers R1 along all of the division lines L as mentioned above, an etching gas 7 is supplied to the wafer W from the back side W2 as shown in FIG. 6, thereby performing dry etching to the back side W2. Although not shown, the supply of the etching gas 7 is performed in a gastight vacuum chamber. For example, a plasma gas of $SF_6$ (sulfur hexafluoride) may be used as the etching gas 7. As a result, the back side W2 of the wafer W is eroded along the modified layers R1 by the etching gas 7, so that the modified layers R1 are removed to form a plurality of grooves G1 respectively corresponding to the modified layers R1 as shown in FIGS. 7 and 8. Accordingly, the wafer W is divided along the grooves G1 to obtain the individual devices D as shown in FIG. 8.

The dry etching using the etching gas 7 may be replaced by wet etching using an etching liquid. In the case of wet etching, the wafer W is immersed in an etching liquid such as KOH (potassium hydroxide). Although the back side W2 of the wafer W is also etched, there is no problem because the etch rate of the modified layers R1 is higher than that of the back side W2.

2. Second Preferred Embodiment (1) Protective Member Attaching Step

Figure 9A:
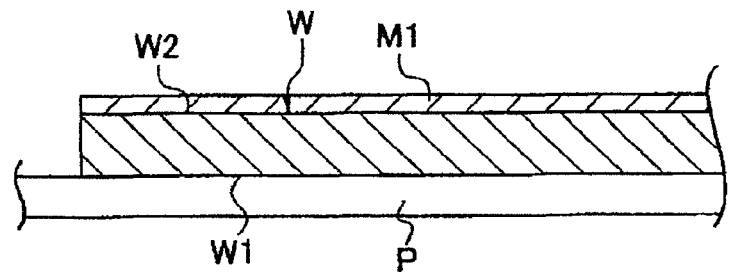
FIGS. 9A to 9D are sectional views showing the steps of a wafer dividing method according to a second preferred embodiment of the present invention.

As shown in FIG. 9A, the front side W1 of a wafer W is attached to a protective member P such as an adhesive tape. As shown in FIG. 2, a ring-shaped frame F is preliminarily attached to a peripheral portion of the protective member P. Thus, the wafer W is supported through the protective member P to the frame F. In this condition, the back side W2 of the wafer W is exposed. The protective member attaching step is performed essentially before a modified layer forming step to be hereinafter described.

(2) Etching Mask Forming Step

Figure 9B:
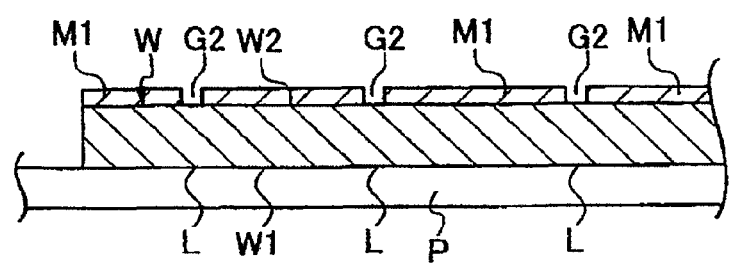

As shown in FIG. 9A, an etching mask M1 is provided so as to fully cover the back side W2 of the wafer W (etching mask preparing step). For example, a resist film or an SiO$_2$ (silicon dioxide) film may be used as the etching mask M1. The etching mask M1 may be formed by thermal oxidation, for example. After fully covering the back side W2 with the etching mask M1, the etching mask M1 is partially removed in a plurality of areas corresponding to the division lines L to thereby form a plurality of grooves G2 along the division lines L as shown in FIG. 9B (etching mask removing step). In the case that the etching mask M1 is provided by a resist film, a photomask may be used to partially expose the resist film in the areas corresponding to the division lines L, thereby forming the grooves G2. In the case that the etching mask M1 is provided by an SiO$_2$ film, the grooves G2 may be formed by dicing the SiO$_2$ film.

Figure 9C:
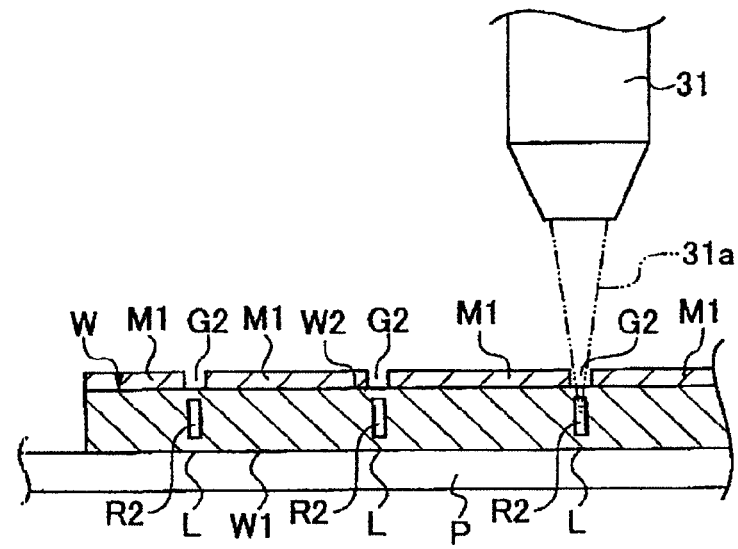

As a modification, the grooves G2 may be formed by applying a laser beam to the etching mask M1. In this case, the laser processing conditions in forming the grooves G2 may be set as follows:

Wavelength of the laser beam: 355 nm
Average power: 1.0 W
Repetition frequency: 10 kHz
Spot diameter: 20 μm
Feed speed: 100 mm/sec (3) Modified Layer Forming Step As shown in FIG. 9C, a laser beam 31$a$ having a transmission wavelength to the wafer W is applied from a laser head 31 through the grooves G2 of the etching mask M1 and the back side W2 of the wafer W into the wafer W so as to be focused inside the wafer W at the positions below the grooves G2, thereby forming a plurality of modified layers R2 inside the wafer W at the positions below the grooves G2. Since the grooves G2 are respectively formed above the division lines L, the modified layers R2 are formed along the division lines L. The laser processing conditions in performing the modified layer forming step in the second preferred embodiment are similar to those in the first preferred embodiment.

(4) Etching Step

Figure 9D:
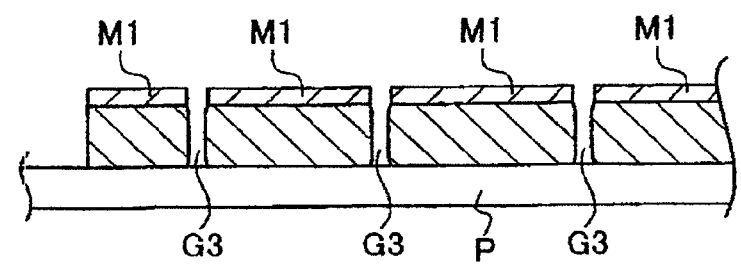

After forming the modified layers R2 inside the wafer W, dry etching or wet etching is performed to erode the modified layers R2 as in the first preferred embodiment. Accordingly, as shown in FIG. 9D, the modified layers R2 are removed to form a plurality of grooves G3 along the division lines L, thereby dividing the wafer W into the individual devices D. While the protective member attaching step is performed before the etching mask forming step in this preferred embodiment, the protective member attaching step may be performed after the etching mask forming step.

3. Third Preferred Embodiment (1) Protective Member Attaching Step

Figure 10:
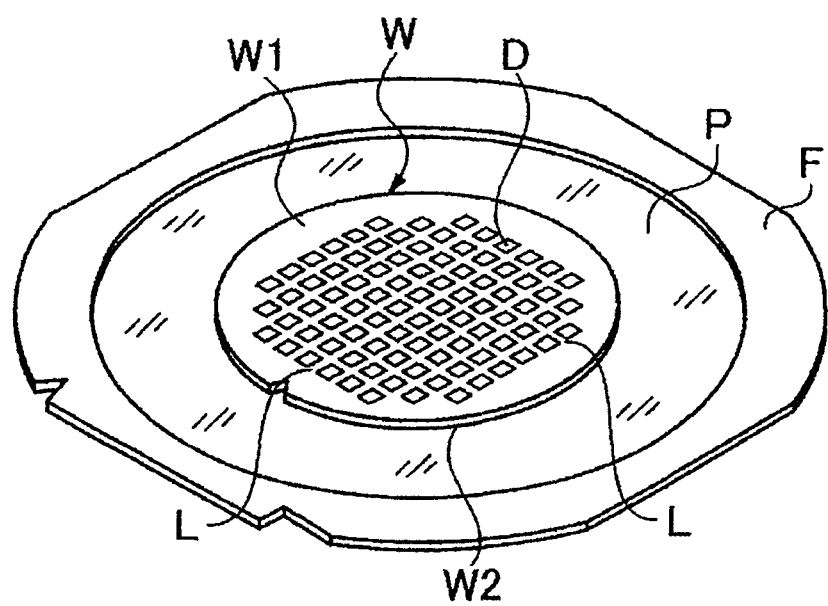
FIG. 10 is a perspective view showing a condition where the back side of the wafer is attached to a protective member supported at its peripheral portion to an annular frame.

As shown in FIG. 10, the back side W2 of a wafer W is attached to a protective member P such as an adhesive tape. A ring-shaped frame F is preliminarily attached to a peripheral portion of the protective member P. Thus, the wafer W is supported through the protective member P to the frame F. In this condition, the front side W1 of the wafer W is exposed. The front side W1 is partitioned by a plurality of crossing division lines L to form a plurality of devices D. The protective member attaching step is performed essentially before a modified layer forming step to be hereinafter described.

(2) Etching Mask Forming Step

Figure 11A:
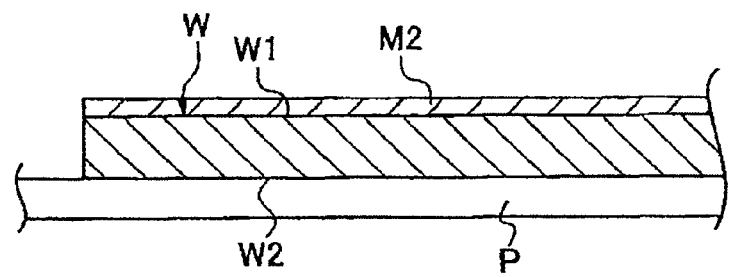
FIGS. 11A to 11D are sectional views showing the steps of a wafer dividing method according to a third preferred embodiment of the present invention.
Figure 11B:
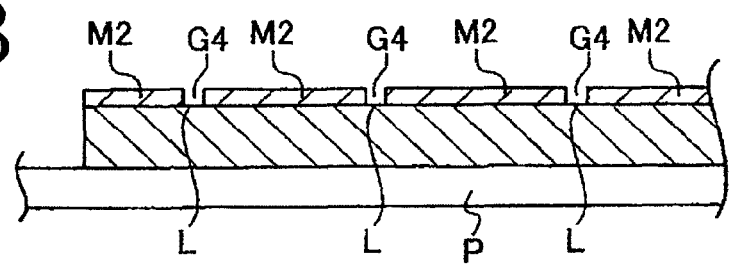

As shown in FIG. 11A, an etching mask M2 is provided so as to fully cover the front side W1 of the wafer W (etching mask preparing step). For example, a resist film may be used as the etching mask M2, similarly to the second embodiment. Thereafter, the etching mask M2 is partially removed in a plurality of areas corresponding to the division lines L to thereby form a plurality of grooves G4 along the division lines L as shown in FIG. 11B (etching mask removing step). The grooves G4 can be formed by a method similar to the forming method for the grooves G2 in the second preferred embodiment.

(3) Modified Layer Forming Step

Figure 11C:
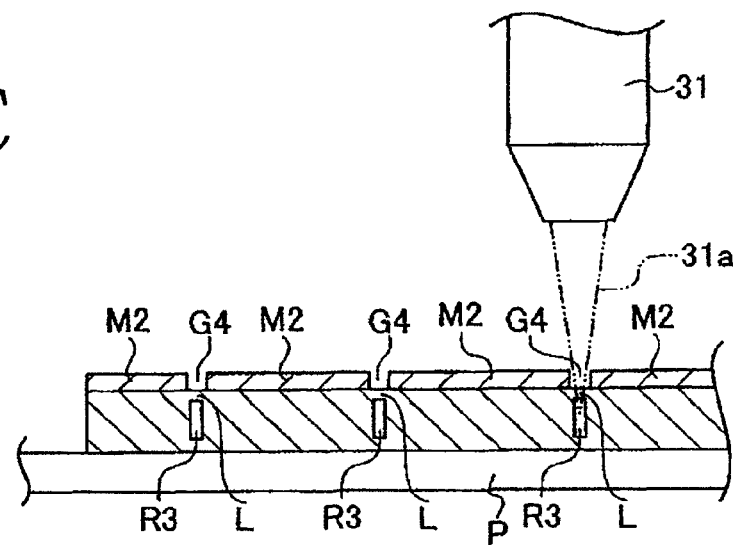

As shown in FIG. 11C, a laser beam 31$a$ having a transmission wavelength to the wafer W is applied from a laser head 31 through the grooves G4 of the etching mask M2 and the front side W1 of the wafer W into the wafer W at the positions below the grooves G4, thereby forming a plurality of modified layers R3 inside the wafer W at the positions below the grooves G4. Since the grooves G4 are respectively formed above the division lines L, the modified layers R3 are formed along the division lines L. The laser processing conditions in performing the modified layer forming step in the third preferred embodiment are similar to those in the first preferred embodiment.

(4) Etching Step

Figure 11D:
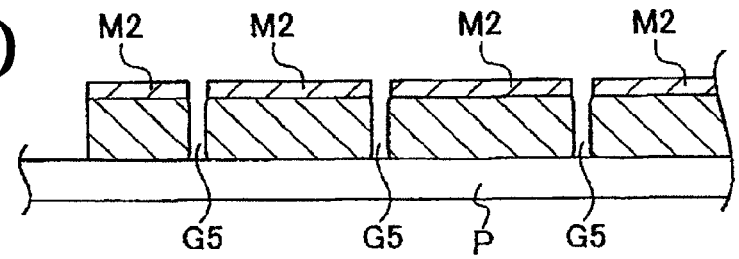
Figure 12:
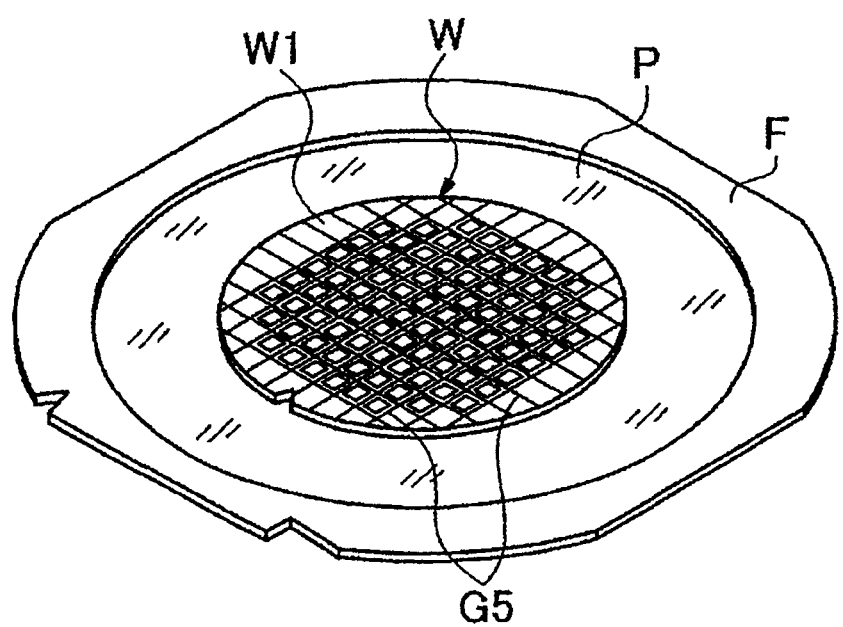
FIG. 12 is a perspective view showing the wafer divided by the wafer dividing method according to the third preferred embodiment.

After forming the modified layers R3 inside the wafer W, dry etching or wet etching is performed to erode the modified layers R3 as in the first preferred embodiment. Accordingly, as shown in FIGS. 11D and 12, the modified layers R3 are removed to form a plurality of grooves G5 along the division lines L, thereby dividing the wafer W into the individual devices D.

According to the first to third preferred embodiments mentioned above, the modified layer forming step is performed to form the modified layers inside the wafer W along the division lines L. Thereafter, the etching step is performed to erode the modified layers, thereby removing the modified layers. Accordingly, the generation of fine particles from the modified layers can be prevented, so that there is no possibility that the fine particles may stick to the surface of each device to cause a reduction in quality of each device. Further, since the modified layers are removed by etching, it is possible to prevent a reduction in die strength of each device due to the remainder of the modified layers.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer dividing method of dividing a wafer into a plurality of devices formed on a front side of said wafer so as to be partitioned by a plurality of division lines, said wafer dividing method comprising:

an etching mask preparing step of preparing an etching mask so that said etching mask fully covers the back side of said wafer;

an etching mask removing step of partially removing said etching mask along said division lines to partially expose the back side of said wafer along said division lines;

a modified layer forming step of applying a laser beam having a transmission wavelength to said wafer in a condition where the focal point of said laser beam is set inside said wafer at the positions corresponding to said division lines, thereby forming a plurality of modified layers inside said wafer along said division lines, each of said modified layers having a thickness ranging from the vicinity of the front side of said wafer to the vicinity of a back side of said wafer; and an etching step of supplying an etching liquid to said wafer to erode said modified layers and thereby form a groove corresponding to each of said modified layers, whereby said grooves extend from the front side of the wafer to the back side of the wafer, thereby dividing said wafer into said individual devices, wherein said modified layer forming step is performed by applying said laser beam to an exposed part of the back side of said wafer.

2. A wafer dividing method of dividing a wafer into a plurality of devices formed on a front side of said wafer so as to be partitioned by a plurality of division lines, said wafer dividing method comprising:

an etching mask preparing step of preparing an etching mask so that said etching mask fully covers the front side of said wafer;

an etching mask removing step of partially removing said etching mask along said division lines to partially expose the front side of said wafer along said division lines;

a modified layer forming step of applying a laser beam having a transmission wavelength to said wafer in a condition where the focal point of said laser beam is set inside said wafer at the positions corresponding to said division lines, thereby forming a plurality of modified layers inside said wafer along said division lines, each of said modified layers having a thickness ranging from the vicinity of the front side of said wafer to the vicinity of a back side of said wafer; and an etching step of supplying an etching liquid to said wafer to erode said modified layers and thereby form a groove corresponding to each of said modified layers, whereby said grooves extend from the front side of the wafer to the backside of the wafer, thereby dividing said wafer into said individual devices;

wherein said modified layer forming step is performed by applying said laser beam to an exposed part of the front side of said wafer.

3. A wafer dividing method of dividing a wafer into a plurality of devices formed on a front side of said wafer so as to be partitioned by a plurality of division lines, said wafer dividing method comprising:

an etching mask preparing step of preparing an etching mask so that said etching mask fully covers the back side of said wafer;

an etching mask removing step of partially removing said etching mask along said division lines to partially expose the back side of said wafer along said division lines;

a modified layer forming step of applying a laser beam having a transmission wavelength to said wafer in a condition where the focal point of said laser beam is set inside said wafer at the positions corresponding to said division lines, thereby forming a plurality of modified layers inside said wafer along said division lines, each of said modified layers having a thickness ranging from the vicinity of the front side of said wafer to the vicinity of a back side of said wafer;

an etching step of supplying an etching gas or an etching liquid to said wafer to erode said modified layers and thereby form a groove corresponding to each of said modified layers, whereby said grooves extend from the front side of the wafer to the back side of the wafer, thereby dividing said wafer into said individual devices, wherein said modified layer forming step is performed by applying said laser beam to an exposed part of the back side of said wafer, and wherein said etching step is performed by immersing said wafer in an etching liquid.

4. A wafer dividing method of dividing a wafer, including a plurality of devices formed on a front side of said wafer, configured to be partitioned by a plurality of division lines, said wafer dividing method comprising:

a modified layer forming step of applying a laser beam having a transmission wavelength to said wafer in a condition where the focal point of said laser beam is set inside said wafer at the positions corresponding to said division lines, thereby forming a plurality of modified layers inside said wafer along said division lines, each of said modified layers having a thickness ranging from the vicinity of the front side of said wafer to the vicinity of a back side of said wafer; and an etching step of supplying an etching liquid to said front side of said wafer to erode said modified layers, thereby dividing said wafer along said division lines.

5. A wafer dividing method of dividing a wafer into a plurality of devices formed on a front side of said wafer so as to be partitioned by a plurality of division lines, said wafer dividing method comprising:

an etching mask preparing step of preparing an etching mask so that said etching mask fully covers the front side of said wafer;

an etching mask removing step of partially removing said etching mask along said division lines to partially expose the front side of said wafer along said division lines;

a modified layer forming step of applying a laser beam having a transmission wavelength to said wafer in a condition where the focal point of said laser beam is set inside said wafer at the positions corresponding to said division lines, thereby forming a plurality of modified layers inside said wafer along said division lines, each of said modified layers having a thickness ranging from the vicinity of the front side of said wafer to the vicinity of a back side of said wafer;

an etching step of supplying an etching gas or an etching liquid to said wafer to erode said modified layers and thereby form a groove corresponding to each of said modified layers, whereby said grooves extend from the front side of the wafer to the backside of the wafer, thereby dividing said wafer into said individual devices, wherein said modified layer forming step is performed by applying said laser beam to an exposed part of the front side of said wafer, and wherein said etching step is performed by immersing said wafer in an etching liquid.

* * * * *